US011373971B2

(12) United States Patent
Chen et al.

(10) Patent No.: US 11,373,971 B2
(45) Date of Patent: Jun. 28, 2022

(54) SEMICONDUCTOR DEVICE STRUCTURE AND METHODS OF FORMING THE SAME

(71) Applicant: TAIWAN SEMICONDUCTOR MANUFACTURING CO., LTD., Hsinchu (TW)

(72) Inventors: Hsin-Chi Chen, Tainan (TW); Hsun-Ying Huang, Tainan (TW); Chih-Ming Lee, Tainan (TW); Shang-Yen Wu, Tainan (TW); Chih-An Yang, Tainan (TW); Hung-Wei Ho, Kaohsiung (TW); Chao-Ching Chang, Kaohsiung (TW); Tsung-Wei Huang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 102 days.

(21) Appl. No.: 16/917,640

(22) Filed: Jun. 30, 2020

(65) Prior Publication Data
US 2021/0407947 A1 Dec. 30, 2021

(51) Int. Cl.
*H01L 21/00* (2006.01)
*H01L 23/00* (2006.01)
(Continued)

(52) U.S. Cl.
CPC ........ *H01L 24/14* (2013.01); *H01L 21/76802* (2013.01); *H01L 21/76877* (2013.01);
(Continued)

(58) Field of Classification Search
CPC .............. H01L 24/14; H01L 21/76802; H01L 21/76877
See application file for complete search history.

(56) References Cited

U.S. PATENT DOCUMENTS

| 6,017,614 A | 1/2000 | Tsai et al. |
| 8,189,642 B1 * | 5/2012 | Li ....................... H01S 5/18352 |
| | | 372/46.013 |

(Continued)

FOREIGN PATENT DOCUMENTS

| CN | 103904052 A | * | 7/2014 | ....... H01L 21/76838 |
| CN | 113327905 A | * | 8/2021 | ....... H01L 21/76802 |

(Continued)

OTHER PUBLICATIONS

The Office Action and the search report in Taiwanese counterpart 110104321 dated Oct. 21, 2021.

*Primary Examiner* — Laura M Menz
(74) *Attorney, Agent, or Firm* — NZ Carr Law Office PLLC

(57) ABSTRACT

A semiconductor device structure, along with methods of forming such, are described. The structure includes a substrate having one or more devices formed thereon, one or more bonding pads disposed over the substrate, and a first passivation layer disposed over the one or more bonding pads. The first passivation layer includes a first passivation sublayer having a first dielectric material, a second passivation sublayer disposed over the first passivation sublayer, and the second passivation sublayer has a second dielectric material different from the first dielectric material. The first passivation layer further includes a third passivation sublayer disposed over the second passivation sublayer, and the third passivation sublayer has a third dielectric material different from the second dielectric material. At least two of the first, second, and third passivation sublayers each includes a nitride.

20 Claims, 11 Drawing Sheets

(51) Int. Cl.
*H01L 21/768* (2006.01)
*H01L 23/488* (2006.01)

(52) U.S. Cl.
CPC .... *H01L 23/488* (2013.01); *H01L 2224/0401* (2013.01); *H01L 2224/13* (2013.01)

(56) References Cited

U.S. PATENT DOCUMENTS

| | | | |
|---|---|---|---|
| 8,987,922 B2 | 3/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,372,206 B2 | 6/2016 | Wu et al. | |
| 9,496,189 B2 | 11/2016 | Yu et al. | |
| 2009/0128768 A1* | 5/2009 | Kar-Roy | G02F 1/136277 438/30 |
| 2013/0234300 A1 | 9/2013 | Walter et al. | |
| 2015/0243611 A1* | 8/2015 | Liu | H01L 24/80 438/653 |
| 2016/0358882 A1* | 12/2016 | Liu | H01L 24/06 |
| 2018/0108589 A1* | 4/2018 | Aoike | H01L 23/3192 |
| 2019/0304939 A1* | 10/2019 | Bih | H01L 21/76882 |
| 2020/0051935 A1* | 2/2020 | Molgg | H01L 21/0217 |
| 2021/0407947 A1* | 12/2021 | Chen | H01L 21/76802 |

FOREIGN PATENT DOCUMENTS

| | | | | |
|---|---|---|---|---|
| TW | 200616122 A | 5/2006 | | |
| TW | 201703205 A | 1/2017 | | |
| WO | WO-2006087045 A1 * | 8/2006 | | B81C 1/00158 |

\* cited by examiner

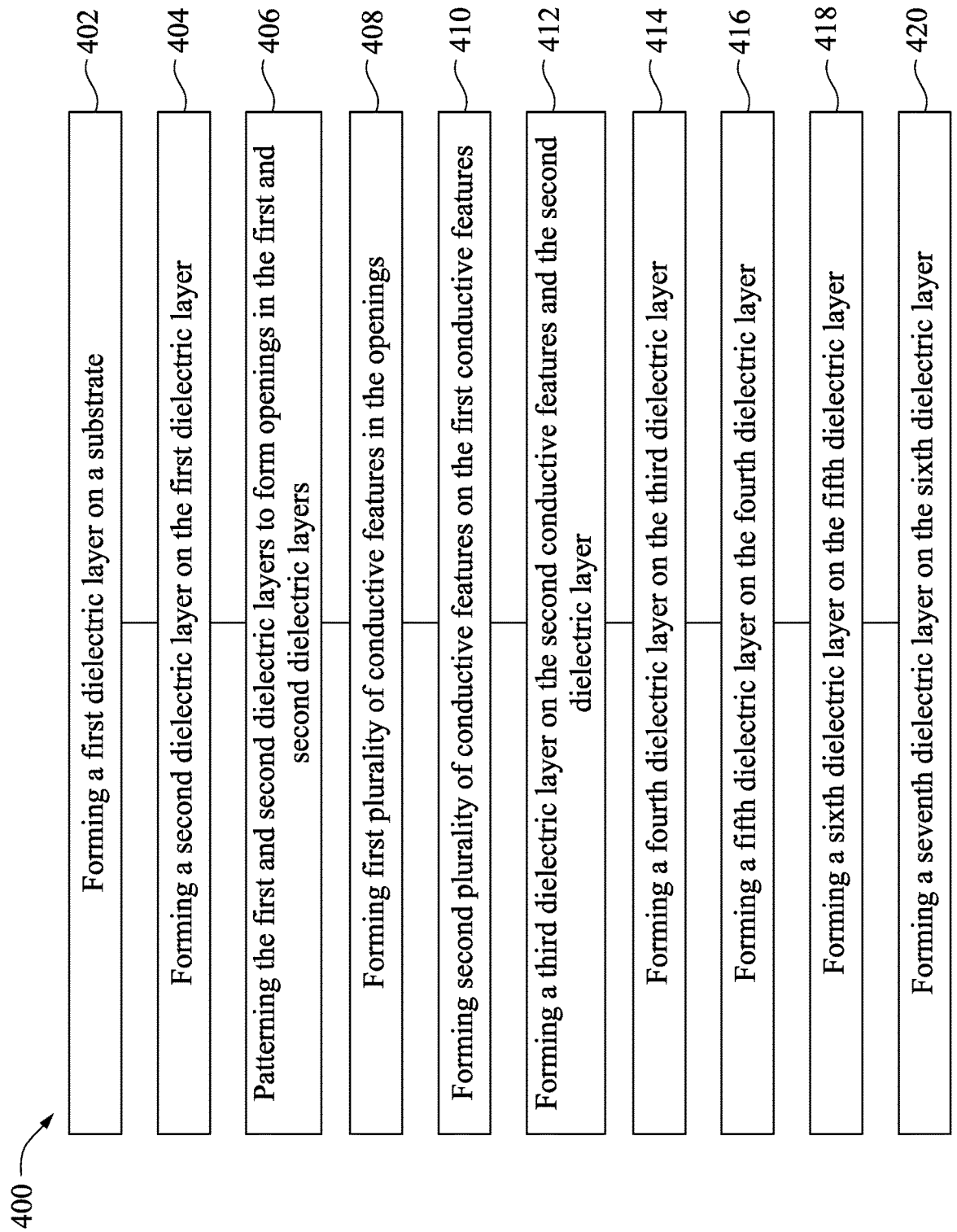

SEMICONDUCTOR DEVICE STRUCTURE AND METHODS OF FORMING THE SAME

BACKGROUND

In the formation of integrated circuits, devices such as transistors are formed on a semiconductor substrate. An interconnection structure is then formed over the integrated circuit devices. A redistribution layer (RDL) is formed over the interconnection structure. The RDL includes at least a conductive feature and a passivation layer, and the conductive feature is electrically connected to the interconnection structure. The passivation layer is formed over the conductive feature.

However, the different materials in the RDL may have different coefficients of thermal expansion. The coefficient of thermal expansion mismatch in the RDL leads to the formation of cracks extending from the RDL to the interconnection structure, which can cause device failure. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flowchart of a method for fabricating the redistribution layer of the semiconductor device structure of FIG. 1, in accordance with some embodiments.

DETAILED DESCRIPTION

Figure 1:
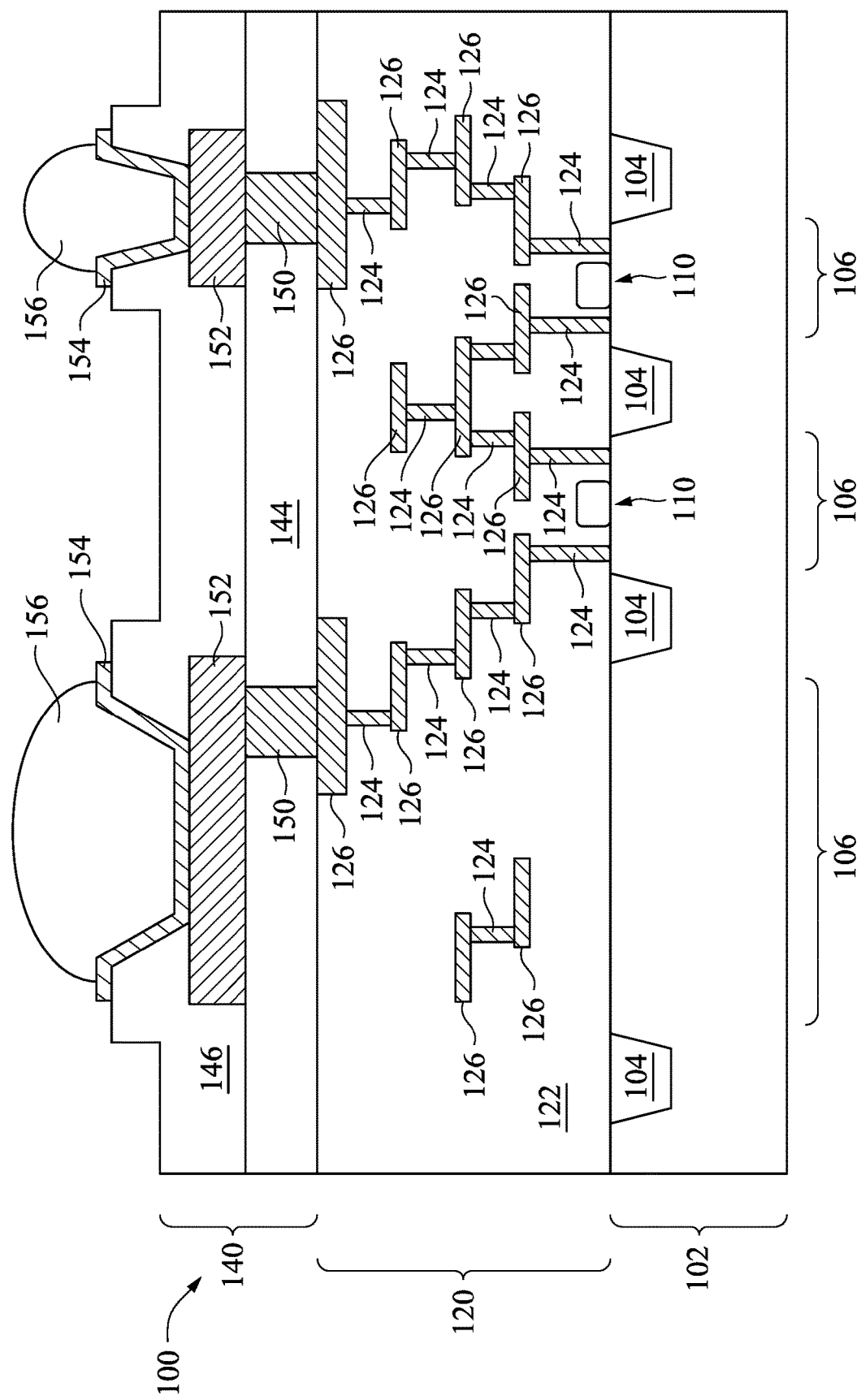
FIG. 1 is a cross-sectional side view of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
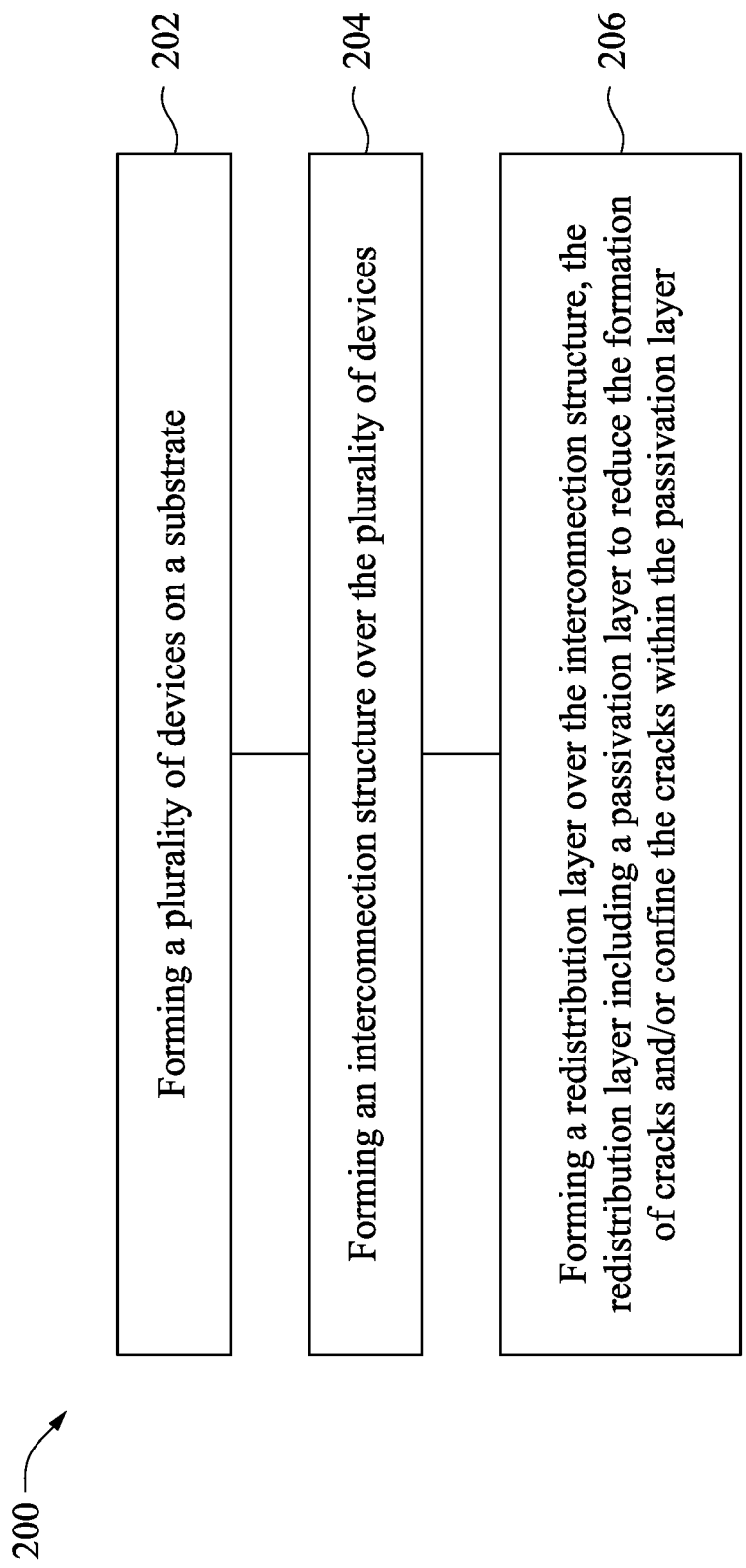
FIG. 2 is a flowchart of a method for fabricating the semiconductor device structure, in accordance with some embodiments.

FIG. 1 is a cross-sectional side view of a semiconductor device structure 100, in accordance with some embodiments. FIG. 2 is a flowchart of a method 200 for fabricating the semiconductor device structure 100, in accordance with some embodiments. The semiconductor device structure 100 and the method 200 making the same are collectively described with reference to FIGS. 1 and 2. The semiconductor device structure 100 may be an integrated circuit (IC) structure having a plurality of IC devices, such as transistors, diodes, sensors, memory cells, or combinations thereof.

The semiconductor device structure 100 includes a substrate 102. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on the substrate 102 and defining various active regions 106 on the substrate 102. The isolation feature 104 utilizes isolation technology, such as shallow trench isolation (STI), to define and electrically isolate the various active regions 106. The isolation feature 104 may be made of silicon oxide, silicon nitride, silicon oxynitride, other suitable dielectric materials, or combinations thereof. The isolation feature 104 is formed by any suitable process. As one example, forming STI features includes a lithography process to expose a portion of the substrate 102, etching a trench in the exposed portion of the substrate 102 (for example, by using a dry etching and/or wet etching), filling the trench (for example, by using a chemical vapor deposition process) with one or more dielectric materials, and planarizing the substrate 102 and removing excessive portions of the dielectric material(s) by a polishing process, such as a chemical mechanical polishing (CMP) process. In some examples, the filled trench may have a multi-layer structure, such as a thermal oxide liner layer and filling layer of silicon oxide.

The active region 106 is a region having various features that are parts of one or more devices 110, such as transistors, diodes, imaging sensors, resistors, capacitors, inductors, memory cells, a combination thereof, and/or other suitable devices. The active region 106 may include a semiconductor material similar to that of the bulk semiconductor material of the substrate 102 (such as silicon) or different semiconductor material, such as silicon germanium, silicon carbide, or multiple semiconductor material layers (such as alternative silicon and silicon germanium layers) formed on the substrate 102 by epitaxial growth, for performance enhancement, such as strain effect to increase carrier mobility. In some embodiments, the active region 106 is three-dimensional, and the devices 110 in the active region 106 may be three-dimensional devices, such as fin field-effect transistors (FinFETs), nanosheet transistors, or other suitable three-dimensional devices.

The substrate 102 may include various doped features, such as n-type doped wells, p-type doped wells, source and drain, other doped features, or a combination thereof configured to form various devices 110 or components of the devices 110.

The semiconductor device structure 100 further includes an interconnection structure 120 formed on the substrate 102, such as on the active regions 106 and the isolation features 104. The interconnection structure 120 includes various conductive features, such as a first plurality of conductive features 124 and second plurality of conductive features 126, and an interlayer dielectric (ILD) 122 to separate and isolate various conductive features 124, 126. In some embodiments, the first plurality of conductive features 124 are conductive vias and the second plurality of conductive features 126 are conductive lines. The interconnection structure 120 includes multiple levels of the conductive features 126, and the conductive features 126 are arranged in each level to provide electrical paths to various devices 110 disposed below. The conductive features 124 provide vertical electrical routing from the substrate 102 to the conductive features 126 and between conductive features 126. The conductive features 124 and conductive features 126 may be made from one or more conductive materials, such as metal, metal alloy, metal nitride, or silicide. For example, the conductive features 124 and the conductive features 126 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. Conductive contacts (not shown) may be formed between the devices 110 and the conductive features 124, and the conductive contacts may be made from tungsten, silicide, nickel, cobalt, copper, other suitable conductive material, or a combination thereof.

The ILD 122 includes one or more dielectric materials to provide isolation functions to various device components (such as gates) and various conductive features (such as conductive lines, vias, and contacts). The ILD 122 may include multiple dielectric layers embedding multiple levels of conductive features 124, 126. The ILD 122 is made from a dielectric material, such as silicon oxide, a low-k dielectric material, other suitable dielectric material, or a combination thereof. In some examples, the low-k dielectric material includes fluorinated silica glass, carbon doped silicon oxide, xerogel, aerogel, amorphous fluorinated carbon, Parylene, bis-benzocyclobutenes, polyimide, and/or other suitable dielectric materials with dielectric constant substantially less than that of the thermal silicon oxide. In some embodiments, the ILD 122 includes silicon oxide, silicon oxycarbide, one or more porous low-k dielectric materials, borophosphosilicate glass, phosphosilicate glass, boron silicate glass, silicon nitride, silicon oxynitride, silicon oxycarbon nitride, high density plasma oxide formed by a high density plasma chemical vapor deposition (HDP-CVD) process or other suitable processes, spin on glass, polyimide, other suitable materials, or a combination thereof. The formation of the ILD 122 includes deposition and CMP processes, for example. The deposition may include spin-on coating, chemical vapor deposition (CVD), plasma enhanced chemical vapor deposition (PECVD), HDP-CVD, other suitable deposition technology, or a combination thereof. The ILD 122 may include multiple layers and is collectively formed with various conductive features in a proper procedure, such as damascene process.

In some embodiments, the interconnection structure 120 or a portion thereof is formed by deposition and patterning. For example, a conductive material, such as aluminum copper, is deposited by physical vapor deposition (PVD), then is patterned by lithography and etching processes. The ILD 122 is then formed on the aluminum copper by a deposition process, such as CVD or PECVD. In some embodiments, the conductive features 124, 126 are formed by a damascene process. A dual damascene process may be performed to form one level of the conductive feature 126 and the conductive feature 124 below the conductive feature 126.

The semiconductor device structure 100 further includes a redistribution layer (RDL) 140 disposed on the interconnection structure 120 to redistribute bonding pads. The RDL 140 helps to arrange the bonding pads, such as from the edge to the center of an IC chip for flip chip bonding or other suitable packaging technology to integrate an IC chip to a board (e.g., a printed circuit board).

The RDL 140 includes one or more passivation layers and conductive features formed in the one or more passivation layers. In some embodiments, the RDL 140 includes a first passivation layer 144 and a second passivation layer 146 disposed on the first passivation layer 144. The first passivation layer 144 may be a single layer of a dielectric material, such as silicon oxide, silicon oxycarbide, one or more porous low-k dielectric materials, undoped silica glass, borophosphosilicate glass, phosphosilicate glass, boron silicate glass, silicon nitride, silicon oxynitride, silicon oxycarbon nitride, high density plasma oxide formed by a HDP-CVD process or other suitable processes, spin on glass, polyimide, other suitable materials, or a combination thereof. In some embodiments, the first passivation layer 144 includes a multi-layer stack of dielectric materials. For example, the first passivation layer 144 may include a silicon nitride layer and an un-doped silica glass layer disposed on the silicon nitride layer. Other configurations of the first passivation layer 144 are within the scope of the disclosure. The second passivation layer 146 includes a multi-layer stack of dielectric materials, and the second passivation layer 146 is further described in detail below.

The RDL 140 includes conductive features 150 and conductive features 152. The conductive features 150 may be conductive vias and the conductive features 152 may be bonding pads. In some embodiments, as shown in FIG. 1, one or more conductive features 150 may be disposed in the first passivation layer 144, and the conductive features 150 may be aligned and in contact with corresponding conductive features 126 located at the top of the interconnection structure 120. One or more conductive features 152 may be disposed on the corresponding conductive features 150 located in the first passivation layer 144. The second passivation layer 146 may be disposed on the conductive features 152 and the first passivation layer 144.

One or more under bump metallurgy (UBM) layers 154 are disposed in the second passivation layer 146 and are in contact with corresponding conductive features 152. A conductive structure 156 is formed on each UBM layer 154. The UBM layer 154 is made from a conductive material, such as copper, aluminum, tungsten, titanium, tantalum, other suitable conductive materials, alloys thereof, or a combination thereof. The UBM layer 154 may contain an adhesion layer and/or a wetting layer. In some embodiments, the UBM layer 154 further includes a seed layer. The conductive structure 156 may be a ball-like bump or a pillar. The conductive structure 156 is made from a conductive material, such as tin, copper, gold, silver, alloys thereof, other suitable materials, or a combination thereof.

FIG. 2 is a flowchart of a method 200 for making the semiconductor device structure 100 in accordance with some embodiments. Some fabrication details are provided above and are not repeated here. The method 200 starts at operation 202 to form a plurality of devices 110 on the substrate 102. The isolation features 104 may be already formed on the substrate 102. At operation 204, the interconnection structure 120 is formed over the plurality of devices 110. The RDL 140 is formed over the interconnection structure 120, at operation 206. The RDL 140 includes the passivation layer 146 which can reduce the formation of cracks in the passivation layer 146 and/or confine the cracks within the passivation layer 146. The method 200 may include other operations before, during or after the above operations. The method to form the RDL 140 is described in detail below.

Figure 3A:
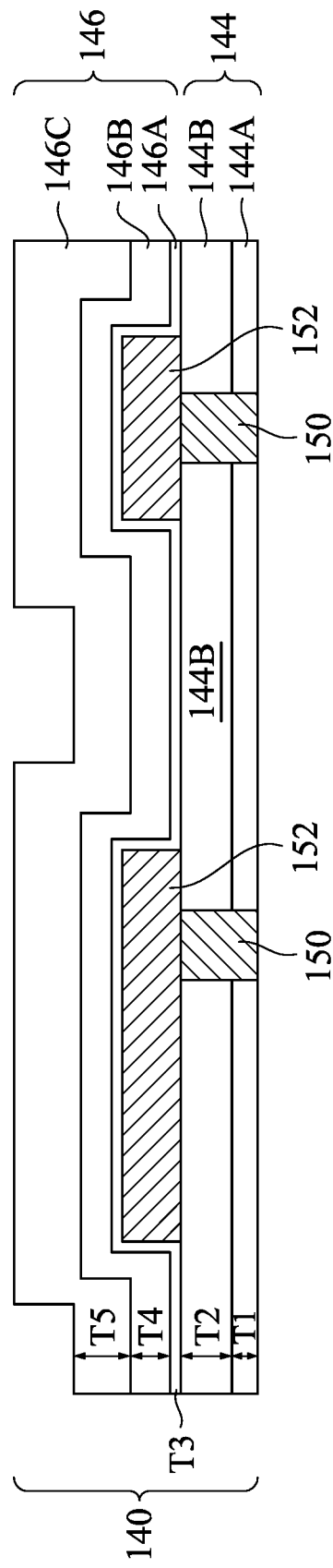
FIGS. 3A and 3B are cross-sectional side views of a redistribution layer at one stage during fabrication of the semiconductor device structure of FIG. 1, in accordance with some embodiments.

FIG. 3A is a cross-sectional side view of the RDL 140 at one stage during fabrication of the semiconductor device structure 100 of FIG. 1, in accordance with some embodiments. As shown in FIG. 3A, in some embodiments, the RDL 140 includes the first passivation layer 144 having a first passivation sublayer 144A and a second passivation sublayer 144B disposed on the first passivation sublayer 144A. The first passivation sublayer 144A is made from a dielectric material, such as silicon oxide, silicon oxycarbide, one or more porous low-k dielectric materials, undoped silica glass, borophosphosilicate glass, phosphosilicate glass, boron silicate glass, silicon nitride, silicon oxynitride, silicon oxycarbon nitride, high density plasma oxide formed by HDP-CVD process or other suitable processes, spin on glass, polyimide, other suitable materials, or a combination thereof. The second passivation sublayer 144B is made from a dielectric material, such as silicon oxide, silicon oxycarbide, one or more porous low-k dielectric materials, undoped silica glass, borophosphosilicate glass, phosphosilicate glass, boron silicate glass, silicon nitride, silicon oxynitride, silicon oxycarbon nitride, high density plasma oxide formed by HDP-CVD process or other suitable processes, spin on glass, or polyimide. The dielectric material of the second passivation sublayer 144B is different from the dielectric material of the first passivation sublayer 144A. In one embodiment, the first passivation sublayer 144A is silicon nitride, and the second passivation sublayer 144B is undoped silica glass. Other configurations of the first passivation layer 144 are within the scope of the disclosure. The first passivation sublayer 144A has a thickness T1 ranging from about 50 nanometers (nm) to about 100 nm. The second passivation sublayer 144B has a thickness T2 ranging from about 500 nm to about 1000 nm.

The conductive features 150 are disposed in the first passivation sublayer 144A and the second passivation sublayer 144B. The conductive features 150 extend through the first passivation sublayer 144A and the second passivation sublayer 144B. The conductive features 152 are disposed on corresponding conductive features 150. The second passivation layer 146 is disposed on the first passivation layer 144 and the conductive features 152. Due to the coefficient of thermal expansion mismatch between the conductive features 152 and the dielectric materials in the RDL 140, tensile stress is induced in the conductive features 152. The induced tensile stress in the conductive features 152 causes the conductive features 152 to warp to form a concave shape, which in turn causes one or more cracks formed in the RDL 140. The cracks can propagate into the interconnection structure 120, leading to device failure. To resolve this issue, the second passivation layer 146 having a multi-layer stack is utilized. In some embodiments, the second passivation layer 146 includes a nitride layer having a thickness that is at least 40 percent, such as from about 40 percent to about 80 percent, of the total thickness of the second passivation layer 146. In some embodiments, the second passivation layer 146 includes two nitride layers. The second passivation layer 146 is described in detail below.

The second passivation layer 146 is a multi-layer stack to reduce formation of cracks in the RDL 140, confine the cracks within the second passivation layer 146, or both. As shown in FIG. 3A, in some embodiments, the second passivation layer 146 includes a first passivation sublayer 146A disposed on the first passivation layer 144 and the conductive features 152, a second passivation sublayer 146B disposed on the first passivation sublayer 146A, and a third passivation sublayer 146C disposed on the second passivation sublayer 146B. One or more of the first, second, third passivation sublayers 146A, 146B, 146C may be conformally formed by a conformal deposition process, such as atomic layer deposition (ALD). Each of the first passivation sublayer 146A, second passivation sublayer 146B, and third passivation sublayer 146C is made from a dielectric material, such as silicon oxide, silicon oxycarbide, one or more porous low-k dielectric materials, undoped silica glass, borophosphosilicate glass, phosphosilicate glass, boron silicate glass, silicon nitride, silicon oxynitride, silicon oxycarbon nitride, high density plasma oxide formed by HDP-CVD process or other suitable processes, spin on glass, polyimide, other suitable materials, or a combination thereof. The adjacent passivation sublayers are fabricated from different dielectric materials. At least one of the first, second, and third passivation sublayers 146A, 146B, 146C is made from a nitride, such as silicon nitride, aluminum nitride, titanium nitride, or tantalum nitride. The nitride-based passivation sublayer has one or more of the following properties: Young's modulus greater than 150 GPa, such as from about 150 GPa to about 350 GPa, fracture toughness greater than 3 MPa·m$^{1/2}$, such as from about 3 MPa·m$^{1/2}$ to about 7 MPa·m$^{1/2}$, or compressive stress greater than −1E9 dyne/cm$^2$, such as from about −1E9 dyne/cm$^2$ to about −3.5E10 dyne/cm$^2$. These properties are referred to as the crack-reducing properties in this disclosure. In one example, one of the first, second, and third passivation sublayers 146A, 146B, 146C is made from silicon nitride, which has all the crack-reducing properties mentioned above.

In some embodiments, one of the first, second, and third passivation sublayers 146A, 146B, 146C is made from a nitride, and the nitride-based passivation sublayer has a thickness that is at least 40 percent, such as from about 40 percent to about 80 percent, of the total thickness of the second passivation layer 146. The nitride-based passivation sublayer having at least one of the crack-reducing properties and a thickness ranging from about 40 percent to about 80 percent of the total thickness of the second passivation layer 146 can reduce the formation of cracks in the passivation layer 146 and/or confine the cracks within the passivation layer 146 by reducing the tensile stress of the conductive feature 152. In one aspect, the nitride-based passivation sublayer has a thickness greater than or equal to 1000 nm, such as from about 1000 nm to about 2000 nm. In some embodiments, the first passivation sublayer 146A is made from undoped silica glass and has a thickness T3 ranging from about 100 nm to about 500 nm, the second passivation sublayer 146B is made from high density plasma oxide and has a thickness T4 ranging from about 1000 nm to about 2000 nm, and the third passivation sublayer 146C is made from silicon nitride and has a thickness T5 greater than or equal to 1000 nm, such as from about 1000 nm to about 2000 nm. In one example, the total thickness of the second passivation layer 146 is about 2300 nm, and the third passivation sublayer 146C has a thickness of about 1000 nm, which is about 43 percent of the total thickness of the second passivation layer 146. In some embodiments, with the third passivation sublayer 146C being made from silicon nitride and having a thickness at least 40 percent of the total thickness of the second passivation layer 146, it has been observed that the tensile stress in the conductive feature 152 disposed below the second passivation layer 146 was decreased by 15 percent to 25 percent, and the device failure rate decreased from 13 percent to five percent, compared to conventional passivation layer.

In some embodiments, two of the first, second, and third passivation sublayers 146A, 146B, 146C are made from a nitride having at least one crack-reducing properties. The two nitride-based passivation sublayers may be made from the same nitride material or different nitride materials. In some embodiments, the two nitride-based passivation sublayers are separated by one or more passivation sublayers. For example, the first passivation sublayer 146A is made from silicon nitride and has the thickness T3 ranging from about 300 nm to about 1000 nm, the second passivation sublayer 146B is made from undoped silica glass and has the thickness T4 ranging from about 100 nm to about 500 nm, and the third passivation sublayer 146C is made from silicon nitride and has the thickness T5 ranging from about 300 nm to about 1000 nm. In one example, the thickness T5 of the third passivation sublayer 146C is greater than the thickness T3 of the first passivation sublayer 146A.

Figure 3B:
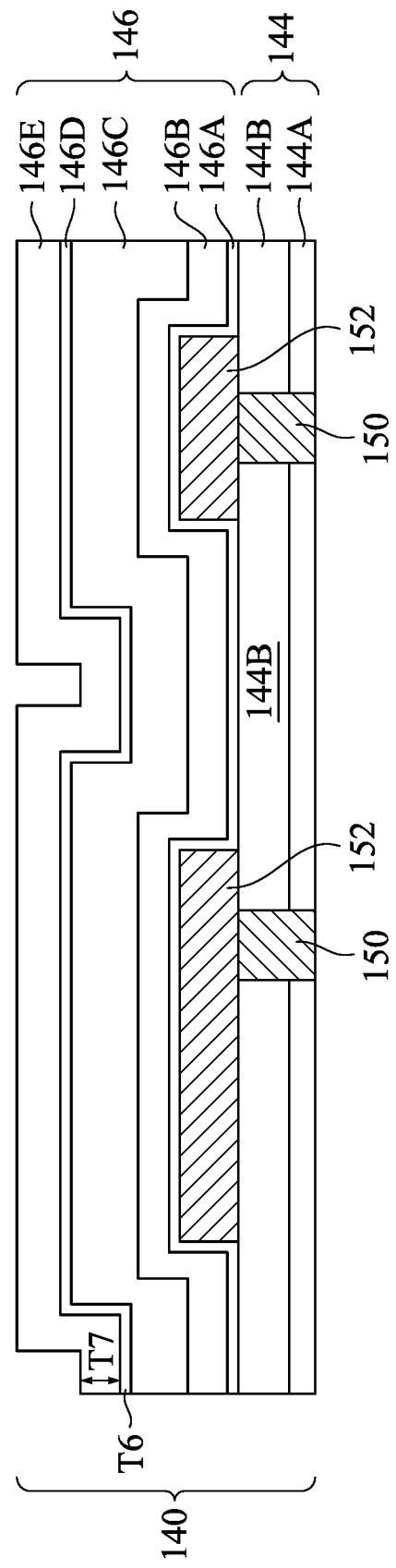

FIG. 3B is a cross-sectional side view of the RDL 140 at one stage during fabrication of the semiconductor device structure 100 of FIG. 1, in accordance with some embodiments. As shown in FIG. 3B, in some embodiments, the RDL 140 includes the first passivation layer 144 having the first passivation sublayer 144A and the second passivation sublayer 144B, the conductive features 150, the conductive features 152, and the second passivation layer 146. In some embodiments, the second passivation layer 146 includes the first passivation sublayer 146A, the second passivation sublayer 146B, the third passivation sublayer 146C, a fourth passivation sublayer 146D disposed on the third passivation sublayer 146C, and a fifth passivation sublayer 146E disposed on the fourth passivation sublayer 146D. One or both of the fourth and fifth passivation sublayers 146D, 146E may be conformally formed by a conformal deposition process, such as ALD. Each of the passivation sublayers 146D-146E is made from a dielectric material, such as silicon oxide, silicon oxycarbide, one or more porous low-k dielectric materials, undoped silica glass, borophosphosilicate glass, phosphosilicate glass, boron silicate glass, silicon nitride, silicon oxynitride, silicon oxycarbon nitride, high density plasma oxide formed by HDP-CVD process or other suitable processes, spin on glass, or polyimide, other suitable materials, or a combination thereof. At least one passivation sublayer of the second passivation layer 146 is made from a nitride having at least one of the crack-reducing properties, and the nitride-based passivation sublayer has a thickness that is at least 40 percent of the total thickness of the second passivation layer 146. The adjacent passivation sublayers are made from different dielectric materials. For example, the first passivation sublayer 146A is made from a material different from the second passivation sublayer 146B, the third passivation sublayer 146C is made from a material different from the second passivation sublayer 146B, the fourth passivation sublayer 146D is made from a material different from the third passivation sublayer 146C, and the fifth passivation sublayer 146E is made from a material different from the fourth passivation sublayer 146D. In some aspects, passivation sublayers not adjacent to each other may be made from the same material.

In some embodiments, one of the first, second, third, fourth, and fifth passivation sublayers 146A, 146B, 146C, 146D, 146E is made from a nitride having at least one of the crack-reducing properties, and the nitride-based passivation sublayer has a thickness that is at least 40 percent, such as from about 40 percent to about 80 percent, of the total thickness of the second passivation layer 146. In another embodiment, at least two of the first, second, third, fourth, and fifth passivation sublayers 146A, 146B, 146C, 146D, 146E are fabricated from a nitride having at least one of the crack-reducing properties. The at least two nitride-based passivation sublayers may be made from the same nitride material or different nitride materials. In some embodiments, the at least two nitride-based passivation sublayers each has a thickness ranging from about 300 nm to about 1000 nm. With two nitride-based passivation sublayers each having at least one of the crack-reducing properties and a thickness ranging from about 300 nm to about 1000 nm, the second passivation layer 146 can reduce the formation of cracks in the passivation layer 146 and/or confine the cracks within the passivation layer 146 by reducing the tensile stress of the conductive feature 152. In one aspect, the two nitride-based passivation sublayers are separated by one or more passivation sublayers. For example, the first passivation sublayer 146A is made from undoped silica glass and has the thickness T3 ranging from about 100 nm to about 500 nm, the second passivation sublayer 146B is made from high density plasma oxide and has the thickness T4 ranging from about 1000 nm to about 2000 nm, the third passivation sublayer 146C is made from silicon nitride and has the thickness T5 ranging from about 300 nm to about 1000 nm, the fourth passivation sublayer 146D is made from undoped silica glass and has a thickness T6 less than about 100 nm, such as from about 50 nm to about 100 nm, and the fifth passivation sublayer 146E is made from silicon nitride and has a thickness T7 ranging from about 300 nm to about 1000 nm. In one aspect, the thickness T7 of the fifth passivation sublayer 146E is greater than the thickness T5 of the third passivation sublayer 146C. In some embodiments, with the third and fifth passivation sublayers 146C, 146E being made from silicon nitride and each having a thickness ranging from about 300 nm to about 1000 nm, tensile stress in the conductive feature 152 disposed below the second passivation layer 146 is decreased by 15 percent to 60 percent, and the device failure rate decreased from 13 percent to zero percent, compared to conventional passivation layer.

The second passivation layer 146 having the passivation sublayers 146A-146C (e.g., embodiments shown in FIG. 3A) or passivation sublayers 146A-146E (e.g., embodiments shown in FIG. 3B) reduces cracks formed in the second passivation layer 146 and/or confines the cracks within the second passivation layer 146. The second passivation layer 146 may be utilized in the RDL 140, as described herein. The second passivation layer 146 may be utilized in other structures where cracks can form and propagate due to mismatch in coefficient of thermal expansion.

Figure 5A:
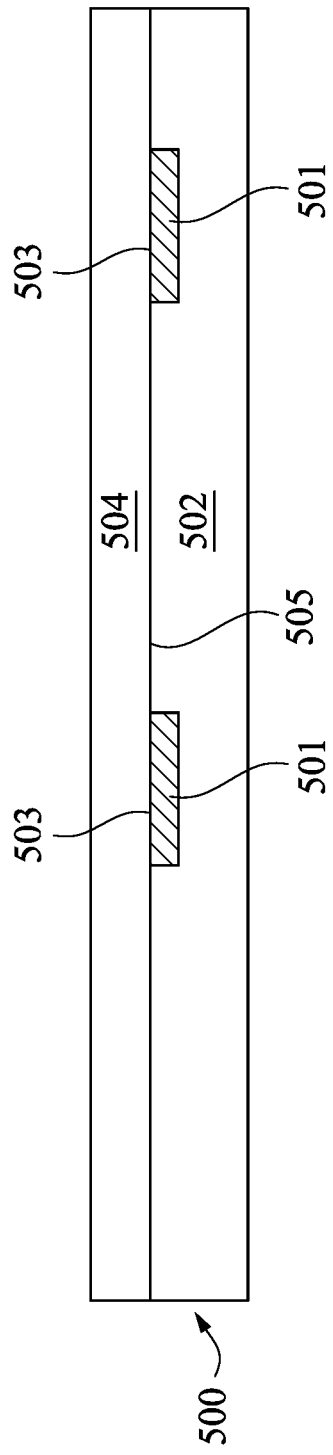
FIGS. 5A-5I illustrate cross-sectional side views of the redistribution layer during various fabrication stages of the method of FIG. 4, in accordance with some embodiments.

FIG. 4 is a flowchart of a method 400 for fabricating the RDL 140 of the semiconductor device structure 100 of FIG. 1, in accordance with some embodiments. FIGS. 5A-5I illustrate cross-sectional side views of the RDL 140 during various fabrication stages of the method 400 of FIG. 4, in accordance with some embodiments. The RDL 140 and the method 400 making the same are collectively described with reference to FIGS. 4 and 5A-5I. As shown in FIGS. 4 and 5A, the method 400 starts at operation 402 to form a first dielectric layer 504 on a substrate 500. The substrate 500 may be the substrate 102 with the interconnection structure 120 disposed thereon, as shown in FIG. 1. The substrate 500 includes a dielectric material 502 and one or more conductive features 501. The dielectric material 502 may be the ILD 122 and the conductive features 501 may be the conductive features 126, as shown in FIG. 1. Each conductive feature 501 has a conductive surface 503, and each dielectric material 502 has a dielectric surface 505. The first dielectric layer 504 may be formed on the conductive surfaces 503 and the dielectric surfaces 505. The first dielectric layer 504 may be deposited by any suitable deposition method, such as ALD, CVD, PECVD, HDP-CVD, or spin-on coating. The first dielectric layer 504 may be the first passivation sublayer 144A of the first passivation layer 144, as shown in FIG. 3B.

Figure 5B:
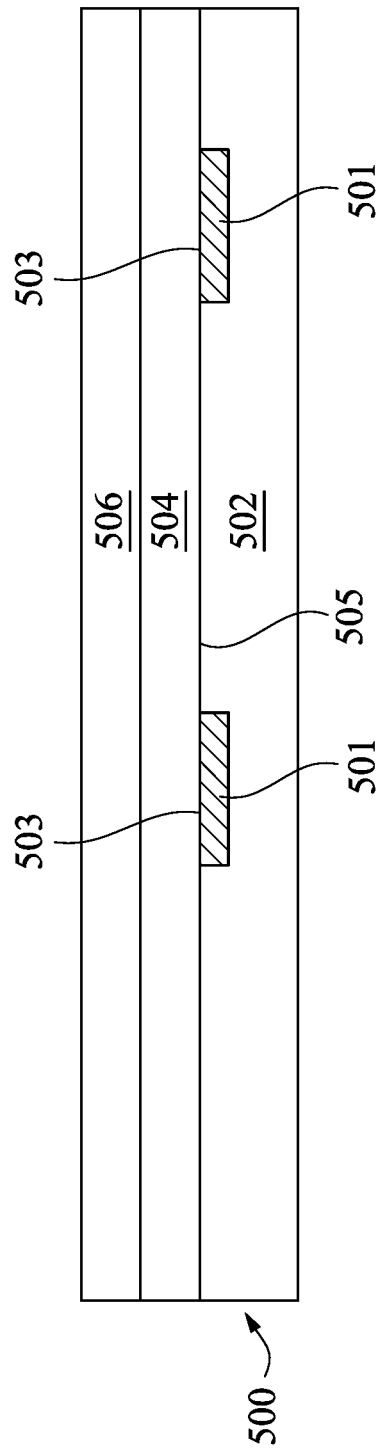
Figure 5C:
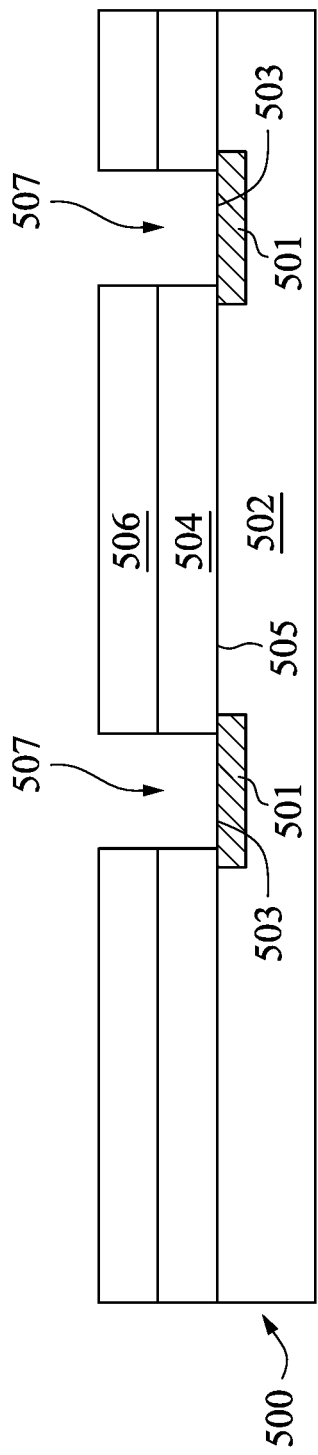

At operation 404, a second dielectric layer 506 is formed on the first dielectric layer 504, as shown in FIG. 5B. The second dielectric layer 506 may be deposited by any suitable deposition method, such as ALD, CVD, PECVD, HDP-CVD, or spin-on coating. The second dielectric layer 506 may be the second passivation sublayer 144B of the first passivation layer 144, as shown in FIG. 3B. Next, at operation 406, the first and second dielectric layers 504, 506 are patterned, and openings 507 are formed in the first and second dielectric layers 504, 506, as shown in FIG. 5C. The patterning of the first and second dielectric layers 504, 506 may include forming a mask on the second dielectric layer 506 and remove portions of the mask located over the conductive features 501. The openings 507 may be formed by any suitable removal process, such as dry etching. The conductive surfaces 503 are exposed through the openings 507, and the dielectric surfaces 505 remain covered by the first and second dielectric layers 504, 506.

Figure 5D:
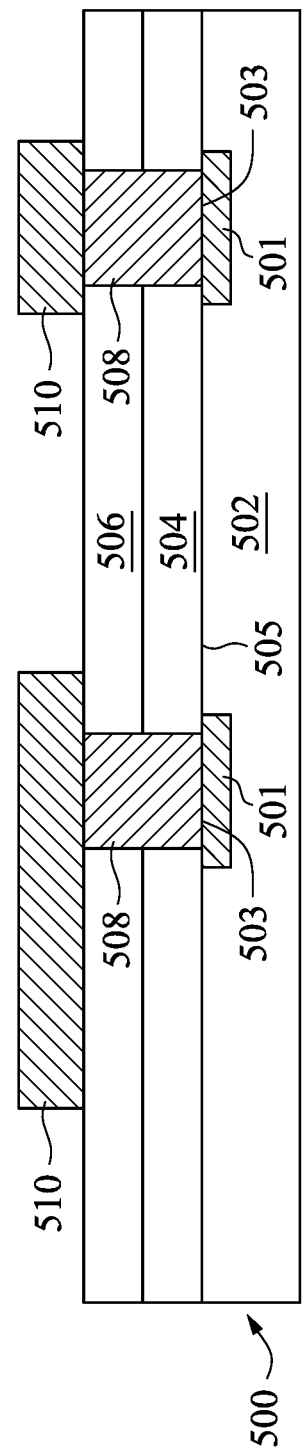

At operation 408, first plurality of conductive features 508 is formed in the openings 507, as shown in FIG. 5D. The conductive features 508 may be the conductive features 150 shown in FIG. 3B. The conductive features 508 may be formed by any suitable deposition method, such as PVD or electro-chemical plating (ECP). A CMP process may be performed after forming the conductive features 508 to remove any conductive material formed on the second dielectric layer 506. Next, at operation 410, a second plurality of conductive features 510 is formed on the conductive features 508, as shown in FIG. 5D. Each conductive feature 510 may be formed on a corresponding conductive feature 508. The conductive features 510 may be the conductive features 152 shown in FIG. 3B. The conductive features 510 may be formed by any suitable deposition method, such as PVD or ECP. In some embodiments, the conductive features 508, 510 are formed by a single deposition process. For example, the deposition process may be performed to fill the openings 507 with a conductive material and to form a layer of conductive material on the second dielectric layer 506, followed by patterning the layer of conductive material and removing portions of the conductive material to form conductive features 510.

Figure 5E:
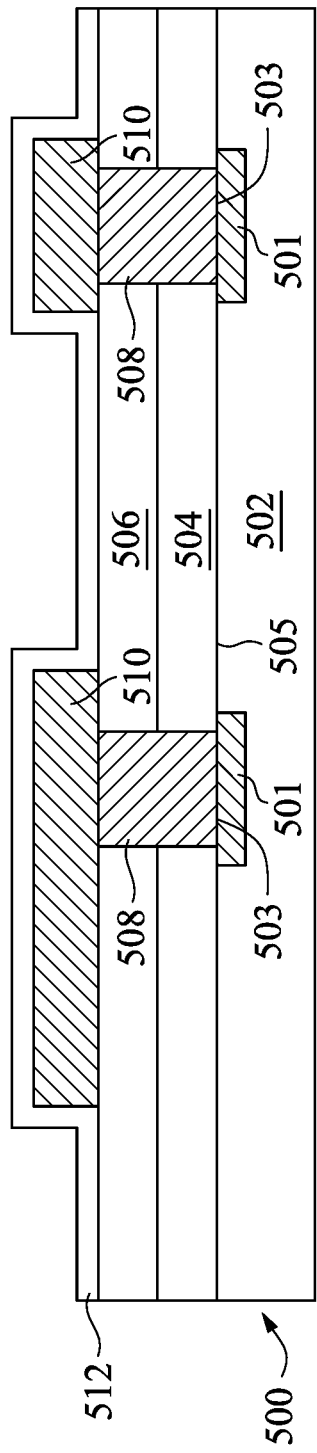
Figure 5F:
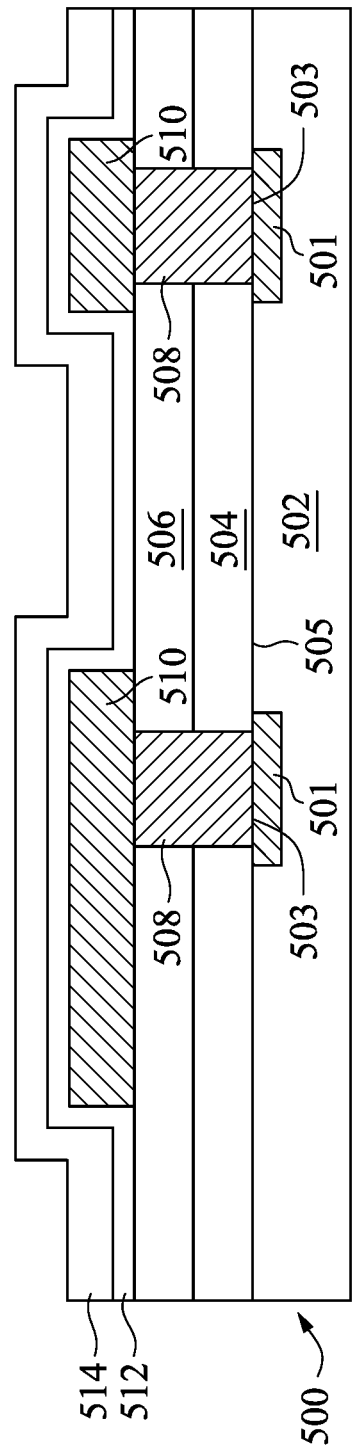

At operation 412, a third dielectric layer 512 is formed on the conductive features 510 and the second dielectric layer 506, as shown in FIG. 5E. The third dielectric layer 512 may be conformally formed. The third dielectric layer 512 may be deposited by any suitable deposition method, such as ALD, CVD, PECVD, HDP-CVD, or spin-on coating. The third dielectric layer 512 may be the first passivation sublayer 146A of the second passivation layer 146, as shown in FIG. 3B. Next, at operation 414, a fourth dielectric layer 514 is formed on the third dielectric layer 512, as shown in FIG. 5F. The fourth dielectric layer 514 may be conformally formed. The fourth dielectric layer 514 may be deposited by any suitable deposition method, such as ALD, CVD, PECVD, HDP-CVD, or spin-on coating. The fourth dielectric layer 514 may be the second passivation sublayer 146B of the second passivation layer 146, as shown in FIG. 3B.

Figure 5G:
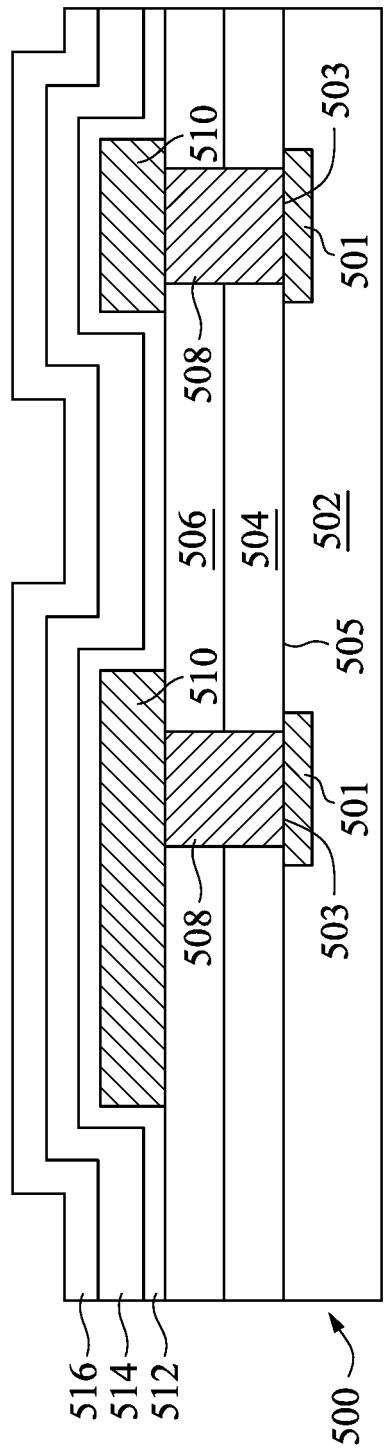

At operation 416, a fifth dielectric layer 516 is formed on the fourth dielectric layer 514, as shown in FIG. 5G. The fifth dielectric layer 516 may be conformally formed. The fifth dielectric layer 516 may be deposited by any suitable deposition method, such as ALD, CVD, PECVD, HDP-CVD, or spin-on coating. The fifth dielectric layer 516 may be the third passivation sublayer 146C of the second passivation layer 146, as shown in FIG. 3B. In some embodiments, the fifth dielectric layer 516 may be made from a nitride. For example, the fifth dielectric layer 516 is made from silicon nitride and is deposited by a PECVD process. An exemplary PECVD process may include flowing precursor gases and additional gases into a process chamber. The precursor gases may be a silicon containing gas and a nitrogen containing gas. The silicon containing gas may include silane, disilane, trimethylsilyl (TMS), tris(dimethylamino)silane (TDMAS), bis(tertiary-butylamino)silane (BTBAS), dichlorosilane (DCS), or combinations thereof. The nitrogen containing gas may include nitrogen, ammonia, or combinations thereof. Additional gases may include a carrier gas and gases that can tune the properties of the silicon nitride layer. The carrier gas may be an inert gas, such as argon. The gases that can tune the properties of the silicon nitride layer may include hydrogen gas, which may increase the compressive stress of the silicon nitride layer. The silicon containing gas has a flow rate ranging from about 10 standard cubic centimeter per minute (sccm) to about 200 sccm, the nitrogen containing gas has a flow rate ranging from about 50 sccm to about 500 sccm, and the carrier gas has a flow rate ranging from about 100 sccm to about 5000 sccm. The RF power may be at a frequency ranging from about 0.3 MHz to about 14 MHz, such as about 13.56 MHz, and the RF power may range from about 10 Watts to about 5000 Watts. The chamber pressure may range from about 10 mTorr to about 15 Torr, and the substrate temperature may range from about 200 degrees Celsius to about 700 degrees Celsius.

In some embodiments, the third dielectric layer 512 is the first passivation sublayer 146A, the fourth dielectric layer 514 is the second passivation sublayer 146B, the fifth dielectric layer 516 is the third passivation sublayer 146C, as shown in FIG. 3A, and the fifth dielectric layer 516 has a thickness that is at least 40 percent of the total thickness of the third, fourth, and fifth dielectric layers 512, 514, 516. Subsequent processes include patterning and removing portions of the third, fourth, fifth dielectric layer 512, 514, 516 to expose the conductive features 510, and forming the UBM layer 154 (FIG. 1) on the conductive features 510. In some embodiments, the fifth dielectric layer 516 has a thickness ranging from about 300 nm to about 1000 nm, and additional dielectric layers are formed on the fifth dielectric layer 516.

Figure 5H:
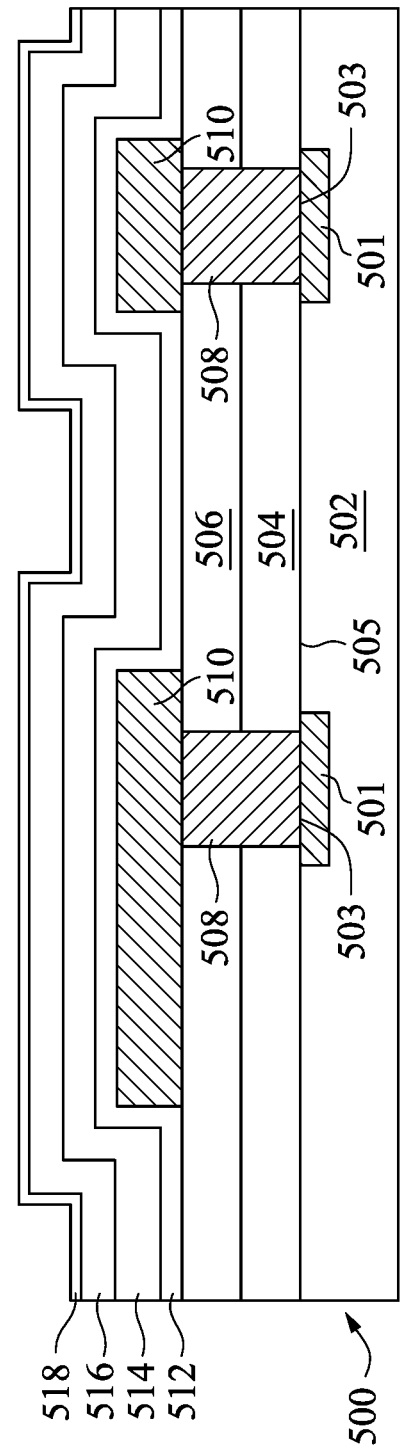

Next, at operation 418, a sixth dielectric layer 518 is formed on the fifth dielectric layer 516, as shown in FIG. 5H. The sixth dielectric layer 518 may be conformally formed. The sixth dielectric layer 518 may be deposited by any suitable deposition method, such as ALD, CVD, PECVD, HDP-CVD, or spin-on coating. The sixth dielectric layer 518 may be the fourth passivation sublayer 146D of the second passivation layer 146, as shown in FIG. 3B.

Figure 5I:
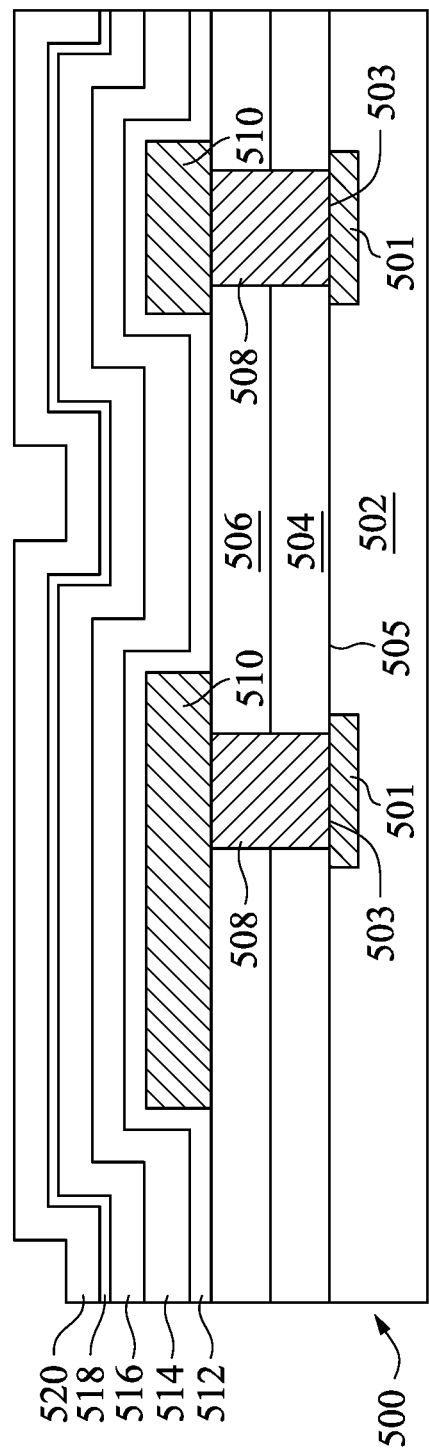

At operation 420, a seventh dielectric layer 520 is formed on the sixth dielectric layer 518, as shown in FIG. 5I. The seventh dielectric layer 520 may be conformally formed. The seventh dielectric layer 520 may be deposited by any suitable deposition method, such as ALD, CVD, PECVD, HDP-CVD, or spin-on coating. The seventh dielectric layer 520 may be the fifth passivation sublayer 146E of the second passivation layer 146, as shown in FIG. 3B. In some embodiments, the seventh dielectric layer 520 may be made from a nitride. In one embodiment, the seventh dielectric layer 520 is made from silicon nitride and is deposited by the PECVD process described above. The seventh dielectric layer 520 has a thickness ranging from about 300 nm to about 1000 nm. In some embodiments, the fifth and seventh dielectric layers 516, 520 are made from a nitride, such as silicon nitride, and the seventh dielectric layer 520 is thicker than the fifth dielectric layer 516.

Figure 6A:
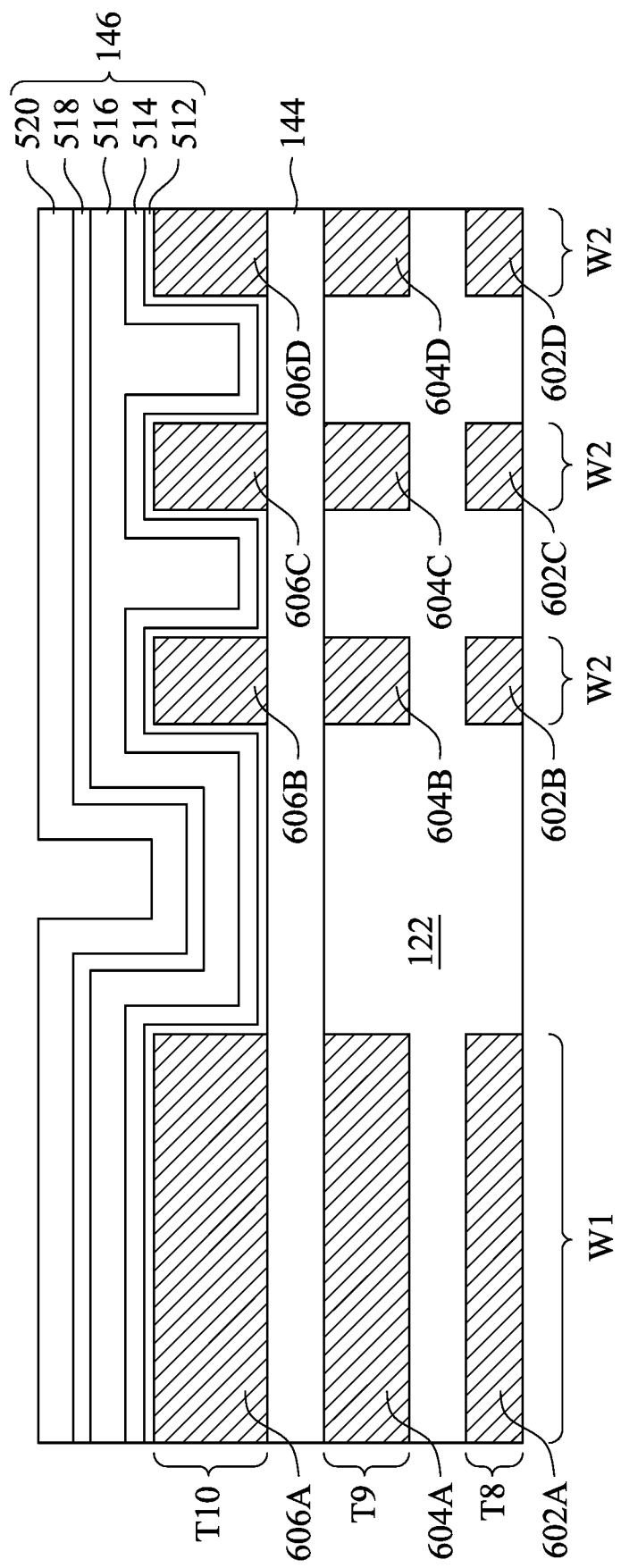
FIG. 6A is a cross-sectional side view of a passivation layer disposed over a plurality of conductive features, in accordance with some embodiments.

Because the second passivation layer 146 can reduce cracks formation and/or confine the cracks within the passivation layer 146, limitations on the dimensions and arrangements of conventional conductive features are expanded. FIG. 6A is a cross-sectional side view of the second passivation layer 146 over a plurality of conductive features, in accordance with some embodiments. As shown in FIG. 6A, the conductive features include a first level of conductive features 602A, 602B, 602C, 602D. The conductive features 602A, 602B, 602C, 602D may be the conductive features 126 disposed in the interconnection structure 120, as shown in FIG. 1. The conductive feature 602A has a first width W1, and the conductive features 602B, 602C, 602D each has a second width W2. In some embodiments, the first width W1 is greater than the second width W2. In some embodiments, the conductive features 602B, 602C, 602D have different widths from each other. The conductive features 602A, 602B, 602C, 602D may be formed by forming a conductive layer, patterning the conductive layer, and removing portions of the conductive layer. In some embodiments, the conductive features 602A, 602B, 602C, 602D have the same thickness T8.

A second level of conductive features 604A, 604B, 604C, 604D is disposed over the conductive features 602A, 602B, 602C, 602D. The conductive features 604A, 604B, 604C, 604D may be the conductive features 126 disposed at the top of the interconnection structure 120, as shown in FIG. 1. Both levels of the conductive features 602A-602D and 604A-604D may be embedded in the ILD 122. In one embodiment, the conductive features 604A, 604B, 604C, 604D are aligned with corresponding conductive features 602A, 602B, 602C, 602D. The conductive vias connecting the two levels of conductive features 602A-602D and 604A-604D are omitted for clarity. The conductive feature 604A may have the same width as or a different width from the width W1 of the conductive feature 602A. The conductive features 604B, 604C, 604D may have the same width as or different widths from each other. In some embodiment, the conductive features 604B, 604C, 604D each has the width W2. The conductive features 604A, 604B, 604C, 604D may be formed by forming a conductive layer, patterning the conductive layer, and removing portions of the conductive layer. In one embodiment, the conductive features 604A, 604B, 604C, 604D have the same thickness T9, and the thickness T9 is greater than the thickness T8.

The first passivation layer 144 is disposed on the second level of conductive features 604A-604D and the ILD 122, as shown in FIG. 6A. A third level of conductive features 606A, 606B, 606C, 606D is disposed on the first passivation layer 144 and over the conductive features 604A, 604B, 604C, 604D. The conductive features 606A, 606B, 606C, 606D may be the conductive features 152 disposed in the RDL 140, as shown in FIG. 1. In some embodiments, the conductive features 606A, 606B, 606C, 606D are aligned with corresponding conductive features 604A, 604B, 604C, 604D. The conductive feature 606A may have the same width as or a different width from the width W1 of the conductive feature 602A. The conductive features 606B, 606C, 606D may have the same width as or different widths from each other. In some embodiments, the conductive features 606B, 606C, 606D each has the width W2. The conductive features 606A, 606B, 606C, 606D may be formed by forming a conductive layer, patterning the conductive layer, and removing portions of the conductive layer. In one embodiment, the conductive features 606A, 606B, 606C, 606D have the same thickness T10, and the thickness T10 is greater than the thickness T9.

Figure 6B:
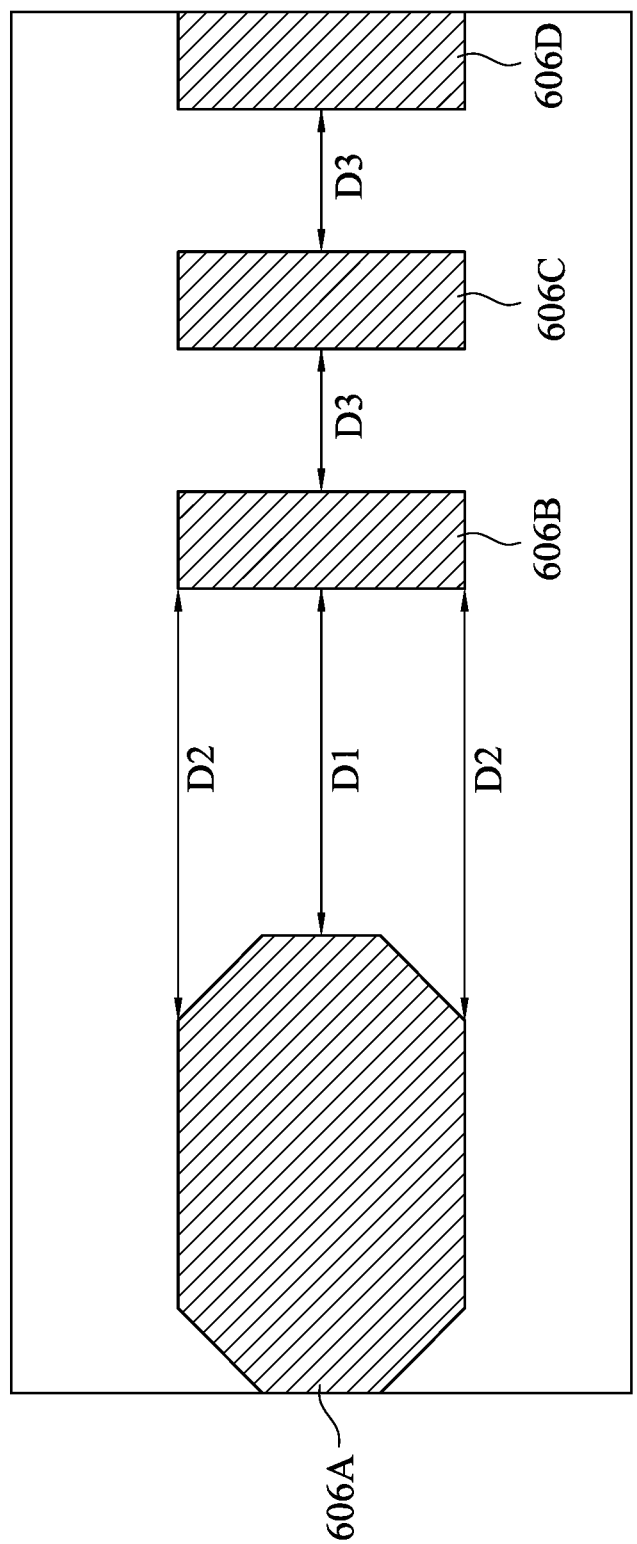
FIG. 6B is a top view of the plurality of the conductive features of FIG. 6A, in accordance with some embodiments.

FIG. 6B is a top view of the plurality of the conductive features 606A-606D of FIG. 6A, in accordance with some embodiments. In some embodiments, the conductive feature 606A is a bonding pad, and the conductive features 606B, 606C, 606D are conductive lines. As shown in FIG. 6B, the conductive feature 606A has a polygonal shape. In one embodiment, the conductive feature 606A is rectangular and has a constant width. In another embodiment, the conductive feature 606A is octagonal and has a width that varies, as shown in FIG. 6B. The conductive feature 606B is adjacent the conductive feature 606A and has a polygonal shape, such as rectangular. In one embodiment, the distance between the conductive feature 606A and the conductive feature 606B is constant. In another embodiment, the distance between the conductive feature 606A and the conductive feature 606B varies. For example, the center portion of the conductive feature 606A is a distance D1 away from the conductive feature 606B, and the edge portions of the conductive feature 606A is a distance D2 away from the conductive feature 606B. Depending on the shape of the conductive feature 606A and/or the shape of the conductive feature 606B, the distance D1 may be greater or less than the distance D2.

In some embodiments, the conductive feature 606C is adjacent the conductive feature 606B and has a polygonal shape, such as rectangular. A distance D3 is between the conductive feature 606C and the conductive feature 606B. In some embodiments, the distance D3 is less than the distance D1, such as about half of the distance D1. The conductive feature 606D is adjacent the conductive feature 606C and has a polygonal shape, such as rectangular. The conductive feature 606C and the conductive feature 606D may be spaced apart by the distance D3.

The present disclosure in various embodiments provides a passivation layer 146 of a semiconductor device structure 100 and the method of making the passivation layer 146. The passivation layer 146 is disposed on a conductive feature and a dielectric material. In one embodiment, the passivation layer 146 includes a plurality of dielectric layers, and at least one layer of the plurality of dielectric layers is made from nitride and has at least one of the following properties: Young's modulus greater than 150 GPa, such as from about 150 GPa to about 350 GPa, fracture toughness greater than 3 MPa·m$^{1/2}$, such as from about 3 MPa·m$^{1/2}$ to about 7 MPa·m$^{1/2}$, or compressive stress greater than −1E9 dyne/cm$^2$, such as from about −1E9 dyne/cm$^2$ to about −3.5E10 dyne/cm$^2$. The nitride-based dielectric layer of the passivation layer 146 has a thickness that is at least 40 percent, such as from about 40 percent to about 80 percent, of the total thickness of the passivation layer 146. In another embodiment, at least two dielectric layers of the passivation layer 146 are made from a nitride having at least one of the properties mentioned above. Some embodiments may achieve advantages. For example, the passivation layer 146 reduces the formation of the cracks in the passivation layer 146 and/or confines the cracks within the passivation layer 146 by reducing the tensile stress of the conductive feature 152, such as a bonding pad, disposed therebelow.

An embodiment is a semiconductor device structure. The structure includes a substrate having one or more devices formed thereon, one or more bonding pads disposed over the substrate, and a first passivation layer disposed over the one or more bonding pads. The first passivation layer includes a first passivation sublayer having a first dielectric material, a second passivation sublayer disposed over the first passivation sublayer, and the second passivation sublayer has a second dielectric material different from the first dielectric material. The first passivation layer further includes a third passivation sublayer disposed over the second passivation sublayer, and the third passivation sublayer has a third dielectric material different from the second dielectric material. At least two of the first, second, and third passivation sublayers each includes a nitride.

Another embodiment is a semiconductor device structure. The structure includes a substrate having one or more devices formed thereon, an interconnection structure disposed on the substrate, one or more bonding pads disposed over the interconnection structure, and a first passivation layer disposed over the one or more bonding pads. The first passivation layer includes a first passivation sublayer having a first dielectric material, a second passivation sublayer disposed over the first passivation sublayer, and the second passivation sublayer has a second dielectric material different from the first dielectric material. The first passivation layer further includes a third passivation sublayer disposed over the second passivation sublayer, and the third passivation sublayer has a third dielectric material different from the second dielectric material. At least one of the first, second, and third passivation sublayers is a nitride layer having a thickness at least 40 percent of a total thickness of the first passivation layer.

A further embodiment is a method. The method includes forming one or more devices on a substrate, forming a first dielectric layer over the one or more devices, forming an opening in the first dielectric layer, forming a first conductive feature in the opening, forming a bonding pad over the first conductive feature, and forming a second dielectric layer on the bonding pad and the first dielectric layer. The forming the second dielectric layer includes forming a first sublayer over the bonding pad and the first dielectric layer. The first sublayer includes a first material. The forming the second dielectric layer further includes forming a second sublayer on the first sublayer, and the second sublayer includes a second material different from the first material. The forming the second dielectric layer further includes forming a third sublayer on the second sublayer, and the third sublayer includes a third material different from the second material. At least two of the first, second, and third sublayers each includes a nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a substrate including one or more devices formed thereon;
   one or more bonding pads disposed over the substrate; and
   a first passivation layer disposed over the one or more bonding pads, wherein the first passivation layer comprises:
   a first passivation sublayer comprising a first dielectric material;
   a second passivation sublayer disposed over the first passivation sublayer, the second passivation sublayer comprising a second dielectric material different from the first dielectric material; and
   a third passivation sublayer disposed over the second passivation sublayer, the third passivation sublayer comprising a third dielectric material different from the second dielectric material, wherein at least two of the first, second, and third passivation sublayers each comprises a nitride.

2. The semiconductor device structure of claim 1, wherein the nitride comprises silicon nitride, aluminum nitride, titanium nitride, or tantalum nitride.

3. The semiconductor device structure of claim 2, wherein the nitride is silicon nitride.

4. The semiconductor device structure of claim 1, wherein the first passivation layer further comprises:
   a fourth passivation sublayer comprising a fourth dielectric material; and
   a fifth passivation sublayer disposed on the fourth passivation sublayer, the fifth passivation sublayer comprising a fifth dielectric material different from the fourth dielectric material, wherein the first passivation sublayer is disposed on the fifth passivation sublayer.

5. The semiconductor device structure of claim 4, further comprising a second passivation layer disposed over the substrate, wherein the second passivation layer comprises:
   a sixth passivation sublayer; and
   a seventh passivation sublayer disposed on the sixth passivation sublayer, wherein the first passivation layer is disposed on the seventh passivation sublayer.

6. The semiconductor device structure of claim 4, wherein the second, fourth, and fifth passivation sublayers each comprises an oxide, and the first and third passivation sublayers each comprises the nitride.

7. The semiconductor device structure of claim 6, wherein the second and fourth passivation sublayers each comprises undoped silica glass, the fifth passivation sublayer comprises high density plasma oxide, and the first and third passivation sublayers each comprises silicon nitride.

8. The semiconductor device structure of claim 1, further comprising an interconnecting structure disposed over the substrate, and the one or more bonding pads are disposed over the interconnecting structure, wherein the interconnection structure comprises:
 a first level of conductive features comprising a first conductive line, a second conductive line adjacent the first conductive line, and a third conductive line adjacent the second conductive line; and
 a second level of conductive lines disposed over the first level of conductive lines, wherein the second level of conductive lines comprises a fourth conductive line, a fifth conductive line adjacent the fourth conductive line, and a sixth conductive line adjacent the fifth conductive line, wherein one bonding pad of the one or more bonding pads is disposed over and aligned with the fourth conductive line of the second level of conductive lines.

9. The semiconductor device structure of claim 8, wherein the first, second, third conductive lines of the first level of conductive lines have a first thickness, the fourth, fifth, sixth conductive lines of the second level of conductive lines have a second thickness, and the bonding pad has a third thickness, wherein the second thickness is greater than the first thickness, and the third thickness is greater than the second thickness.

10. The semiconductor device structure of claim 9, wherein each of the first and fourth conductive lines has a first width, each of the second and fifth conductive lines has a second width, each of the third and sixth conductive lines has a third width, and the bonding pad has the first width, wherein the first width is greater than the second and third widths.

11. The semiconductor device structure of claim 10, wherein the first and fourth conductive lines are a first distance away from the second and fifth conductive lines, respectively, the second and fifth conductive lines are a second distance away from the third and sixth conductive lines, respectively, and the second distance is less than the first distance.

12. The semiconductor device structure of claim 11, further comprising a conductive feature adjacent the bonding pad, wherein the bonding pad is the first distance away from the adjacent conductive feature.

13. The semiconductor device structure of claim 11, further comprising a conductive feature adjacent the bonding pad, wherein the bonding pad has a center portion that is a third distance away from the adjacent conductive feature, and the bonding pad has edge portions that are a fourth distance away from the adjacent conductive feature, wherein the fourth distance is greater than the third distance.

14. A semiconductor device structure, comprising:
 a substrate including one or more devices formed thereon;
 one or more bonding pads disposed over the substrate; and
 a first passivation layer disposed over the one or more bonding pads, wherein the first passivation layer comprises:
  a first passivation sublayer;
  a second passivation sublayer disposed on the first passivation sublayer;
  a third passivation sublayer disposed on the second passivation sublayer;
  a fourth passivation sublayer disposed on the third passivation sublayer; and
  a fifth passivation sublayer disposed on the fourth passivation sublayer, wherein adjacent passivation sublayers comprise different materials.

15. The semiconductor device structure of claim 14, wherein the third passivation sublayer comprises a first nitride.

16. The semiconductor device structure of claim 15, wherein the fifth passivation sublayer comprises a second nitride.

17. The semiconductor device structure of claim 16, wherein the first nitride is the same as the second nitride.

18. The semiconductor device structure of claim 16, wherein the first nitride is different from the second nitride.

19. A semiconductor device structure, comprising:
 a substrate including one or more devices formed thereon;
 one or more bonding pads disposed over the substrate; and
 a first passivation layer disposed over the one or more bonding pads, wherein the first passivation layer comprises:
  a first passivation sublayer comprising undoped silica glass;
  a second passivation sublayer disposed on the first passivation sublayer, wherein the second passivation sublayer comprises an oxide formed by high density plasma;
  a third passivation sublayer disposed on the second passivation sublayer, wherein the third passivation sublayer comprises silicon nitride;
  a fourth passivation sublayer disposed on the third passivation sublayer, wherein the fourth passivation sublayer comprises undoped silica glass; and
  a fifth passivation sublayer disposed on the fourth passivation sublayer, wherein the fifth passivation sublayer comprises silicon nitride.

20. The semiconductor device structure of claim 19, wherein the first passivation sublayer has a thickness ranging from about 100 nm to about 500 nm, the second passivation sublayer has a thickness ranging from about 1000 nm to about 2000 nm, the third passivation sublayer has a thickness ranging from about 300 nm to about 1000 nm, the fourth passivation sublayer has a thickness ranging from about 50 nm to about 100 nm, and the fifth passivation sublayer has a thickness ranging from about 300 nm to about 1000 nm, and wherein the thickness of the fifth passivation sublayer is substantially greater than the thickness of the third passivation sublayer.

* * * * *